(12) United States Patent
Nardi et al.

(10) Patent No.: US 8,872,152 B2
(45) Date of Patent: Oct. 28, 2014

(54) IL-FREE MIM STACK FOR CLEAN RRAM DEVICES

(71) Applicants: Intermolecular Inc., San Jose, CA (US); Kabushiki Kaisha Toshiba, Tokyo (JP); SanDisk 3D LLC, Milpitas, CA (US)

(72) Inventors: Federico Nardi, Palo Alto, CA (US); Yun Wang, San Jose, CA (US)

(73) Assignees: Intermolecular, Inc., San Jose, CA (US); Kabushiki Kaisha Toshiba, Tokyo (JP); SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 13/714,106

(22) Filed: Dec. 13, 2012

(65) Prior Publication Data

US 2014/0166960 A1   Jun. 19, 2014

(51) Int. Cl.
*H01L 47/00* (2006.01)
*H01L 45/00* (2006.01)

(52) U.S. Cl.
CPC .......... *H01L 45/146* (2013.01); *H01L 45/1608* (2013.01)
USPC ............. 257/4; 257/2; 257/3; 257/5; 365/148

(58) Field of Classification Search
USPC .......................................... 257/1–5; 365/148
See application file for complete search history.

(56) References Cited

U.S. PATENT DOCUMENTS

| | | | |
|---|---|---|---|
| 8,354,660 B2 | 1/2013 | Sekar | |
| 8,362,454 B2 | 1/2013 | Lee | |
| 2008/0200003 A1 | 8/2008 | Hong | |
| 2008/0014448 A1 | 9/2008 | Jang et al. | |
| 2009/0302301 A1 | 12/2009 | Hwang | |
| 2010/0038791 A1* | 2/2010 | Lee et al. | 257/758 |
| 2011/0227026 A1 | 9/2011 | Sekar | |
| 2011/0306199 A1* | 12/2011 | Nojiri et al. | 438/618 |
| 2012/0012806 A1* | 1/2012 | Herner | 257/4 |
| 2012/0305857 A1* | 12/2012 | Wu | 252/511 |
| 2012/0305878 A1* | 12/2012 | Miller et al. | 257/4 |

OTHER PUBLICATIONS

Kim, K., et al.; Atomic Layer Deposition of Insulating Nitride Interfacial Layers for Germanium Metal Oxide Semiconductor Field Effect Transistors with Highk OxideTungsten Nitride Gate Stacks; May 21, 2007; Harvard, College (US); Applied Physics Letters pp. 9092.

FormingFree Nitrogen Doped AIOX RRAM with SubA Programming Current; Jan. 1, 2011; Department of Electrical Engineering, Stanford University, Stanford; Symposium on VLSI Technology Digest of Technical Papers.

(Continued)

*Primary Examiner* — Matthew W Such
*Assistant Examiner* — Frederick B Hargrove (57) ABSTRACT

A nonvolatile memory device that contains a resistive switching memory element with improved device switching performance and lifetime, and methods of forming the same. A nonvolatile memory element includes a first electrode layer formed on a substrate, a resistive switching layer formed on the first electrode layer, and a second electrode layer. The resistive switching layer comprises a metal oxide and is disposed between the first electrode layer and the second electrode layer. The elemental metal selected for each of the first and second electrode layers is the same metal as selected to form the metal oxide resistive switching layer. The use of common metal materials within the memory element eliminates the growth of unwanted and incompatible native oxide interfacial layers that create undesirable circuit impedance.

18 Claims, 8 Drawing Sheets

(56) References Cited

OTHER PUBLICATIONS

Vallee, C. et al.; High j for MIM and RRAM applications Impact of the metallic electrode and oxygen vacancies; Jan. 1, 2009; Elsevier Sequoia; Microelectronic Engineering 86 17741776.

Wang, Wei, et al.; Elimination of Forming Process for TiOx Nonvolatile Memory Devices; Jul. 1, 2009; IEEE; IEEE Electron Device Letters vol. 30 No. 7.

Yang, L.M., et al.; Linear Scaling of Reset Current Down to 22nm Node for a Novel CuxSiy O RRAM; Jan. 1, 2013; IEEE; IEEE Electron Device Letters vol. 33 No. 1 pp. 8991.

Wong et al.; MetalOxide RRAM; May 2, 2012; IEEE.

* cited by examiner

IL-FREE MIM STACK FOR CLEAN RRAM DEVICES

BACKGROUND OF THE INVENTION

1. Field of the Invention

This invention relates to nonvolatile memory elements, and more particularly, to methods for forming resistive switching memory elements used in nonvolatile memory devices.

2. Description of the Related Art

Nonvolatile memory elements are used in systems in which persistent storage is required. For example, digital cameras use nonvolatile memory cards to store images and digital music players use nonvolatile memory to store audio data. Nonvolatile memory is also used to persistently store data in computer environments.

Nonvolatile memory is often formed using electrically-erasable programmable read only memory (EEPROM) technology. This type of nonvolatile memory contains floating gate transistors that can be selectively programmed or erased by application of suitable voltages to their terminals.

As fabrication techniques improve, it is becoming possible to fabricate nonvolatile memory elements with increasingly smaller dimensions. However, as device dimensions shrink, scaling issues are posing challenges for traditional nonvolatile memory technology. This has led to the investigation of alternative nonvolatile memory technologies, including resistive switching nonvolatile memory.

Resistive switching nonvolatile memory is formed using memory elements that have two or more stable states with different resistances. Bistable memory has two stable states. A bistable memory element can be placed in a high resistance state or a low resistance state by application of suitable voltages or currents. Voltage pulses are typically used to switch the memory element from one resistance state to the other. Nondestructive read operations can be performed to ascertain the value of a data bit that is stored in a memory cell.

It is believed that conventional films used to form resistive switching layers in resistive switching nonvolatile memory provide a reversible creation/dissolution of a conductive filament through the resistive switching material between two layers serving as electrodes. The physical and chemical properties of the resistive switching layer determine the amount of power needed to switch the resistance states of such films.

Moreover, since the power that can be delivered to a circuit containing a series of resistive switching memory elements and current steering elements is typically limited in most conventional nonvolatile memory devices (e.g., CMOS driven devices), it is desirable to form each of the resistive switching memory elements and current steering elements in the circuit so that the voltage drop across each of these elements is small, and thus resistance of the series connected elements does not cause the current to decrease to an undesirable level due to the fixed applied voltage (e.g., ~2-5 volts).

As nonvolatile memory device sizes shrink, it is important to reduce the required currents and voltages that are necessary to reliably set and reset "on" and "off" states of the device to minimize overall power consumption of the memory chip as well as resistive heating of the device and cross-talk between adjacent devices.

Moreover, as nonvolatile memory device sizes shrink it becomes increasing necessary to assure that the "set" and "reset" currents used to change the state of the memory element are not too large so as to require higher voltage transistors for chip control circuitry, as well as to minimize damage to or alter the electrical or physical properties of the one or more layers found in the formed memory device. A large current flowing through the current carrying lines in a memory array can also undesirably alter or disturb the memory state of other interconnected devices or possibly damage portions of the adjacently connected devices, due to an appreciable amount of "cross-talk" created between them.

Certain materials are known and have been used within the device to lower the programming currents, but these materials through fabrication of the device or through regular device operation can contaminate or alter the properties of the metal oxide switching films and affect the performance of the switching memory element. As the device size continues to shrink and the thickness of the metal oxide switching film continues to scale ever thinner with the device size, any contamination or otherwise alteration of the properties of the metal oxide switching film contributes to a relative increase in forming and programming currents.

There is a need to limit and/or minimize the required current used to program the logic states of each of the interconnected devices in an effort to reduce chip overall power consumption as well as improve device longevity and reduce the possibility of cross-talk between adjacently connected devices, which can alter a nonvolatile memory's device state. It is also desirable to form a nonvolatile memory device that has low programming currents when switching the device between the "on" and "off" states. Therefore, it is desirable to form a nonvolatile memory device that requires low programming currents to change the device between the "on" and "off" states.

SUMMARY OF THE INVENTION

Embodiments described provide for a resistive switching nonvolatile memory element with common elemental metal materials used for the resistive switching layer and each of the adjacent electrodes to eliminate the formation of unwanted native oxide interfacial layers caused by the memory element formation processes. The elimination of unwanted interfacial layers eliminates the additional electrical impedances associated with such layers, thereby reducing variability in the resistance of the designed device and further reducing the necessary forming and programming voltages.

In some embodiments, a nonvolatile memory element includes a first electrode layer, a second electrode layer and a resistive switching layer disposed between the first electrode layer and the second electrode layer. The first electrode layer, the second electrode layer and the resistive switching layer each comprise the same metal.

In some embodiments, the method of forming a nonvolatile memory element in a ReRAM device includes forming a resistive switching layer over a first electrode layer, forming a second electrode layer, so that the resistive switching layer is disposed between the first electrode layer and the second electrode layer. The first electrode layer, the second electrode layer and the resistive switching layer each comprise the same metal.

BRIEF DESCRIPTION OF THE DRAWINGS

So that the manner in which the above recited features can be understood in detail, a more particular description may be had by reference to embodiments, some of which are illustrated in the appended drawings. It is to be noted, however, that the appended drawings illustrate only typical embodiments and are therefore not to be considered limiting of its scope, and may admit to other equally effective embodiments.

While the foregoing is directed to particular embodiments, other and further embodiments may be devised without departing from the basic scope thereof, and the scope thereof is determined by the claims that follow.

DETAILED DESCRIPTION

Embodiments according to the invention generally include a method of forming a nonvolatile memory device that contains a resistive switching memory element that has an improved device switching performance and increased usable lifetime. Embodiments provide a metal-insulator-metal (MIM) stack structure that is free from unwanted native oxide interfacial layers that are generated during the material deposition and device fabrication process. It is noted that relative directional terms used herein with regard to embodiments described are for purposes of description only, and do not limit its configuration as would be understood by a person skilled in the art. Specifically, directional terms such as "over," "above," "under," and the like are used under the assumption that substrate 201 on which embodiments are formed is a "bottom" element and is therefore "under" elements of the structures formed thereon.

In some embodiments, a nonvolatile memory element includes a resistive switching layer formed between a first metal electrode layer and a second metal electrode layer. The elemental material selected for the first and second metal electrode layer includes the same elemental material as the elemental material selected for the metal oxide resistive switching layer. For example, if the first and second electrode layers are formed of a material comprising hafnium, then the use (selection) of hafnium oxide as the resistive switching layer eliminates the formation of undesirable interfacial layers as any oxide growth between the electrode layers and the resistive switching layer will have the same metal-oxide elemental materials as the resistive switching layer. In this example, the MIM materials are compatible because the resistive switching layer is hafnium oxide and the electrode layers are both hafnium, any native oxide growth between these layers would be hafnium oxide as there are no other sources of metal.

The electrical properties of the formed MIM resistive switching device structure are selected to lower the power required to change the resistive switching layer from a low resistance state (LRS) to a high resistance state (HRS) and vice-versa. It is generally desirable to form the resistive switching layer so that its material and electrical properties will not degrade or breakdown during the often high current "burn-in" type device preparation steps, such as the "electrical forming" process, and also during normal repetitive operation of the nonvolatile resistive switching memory device.

Figure 1:
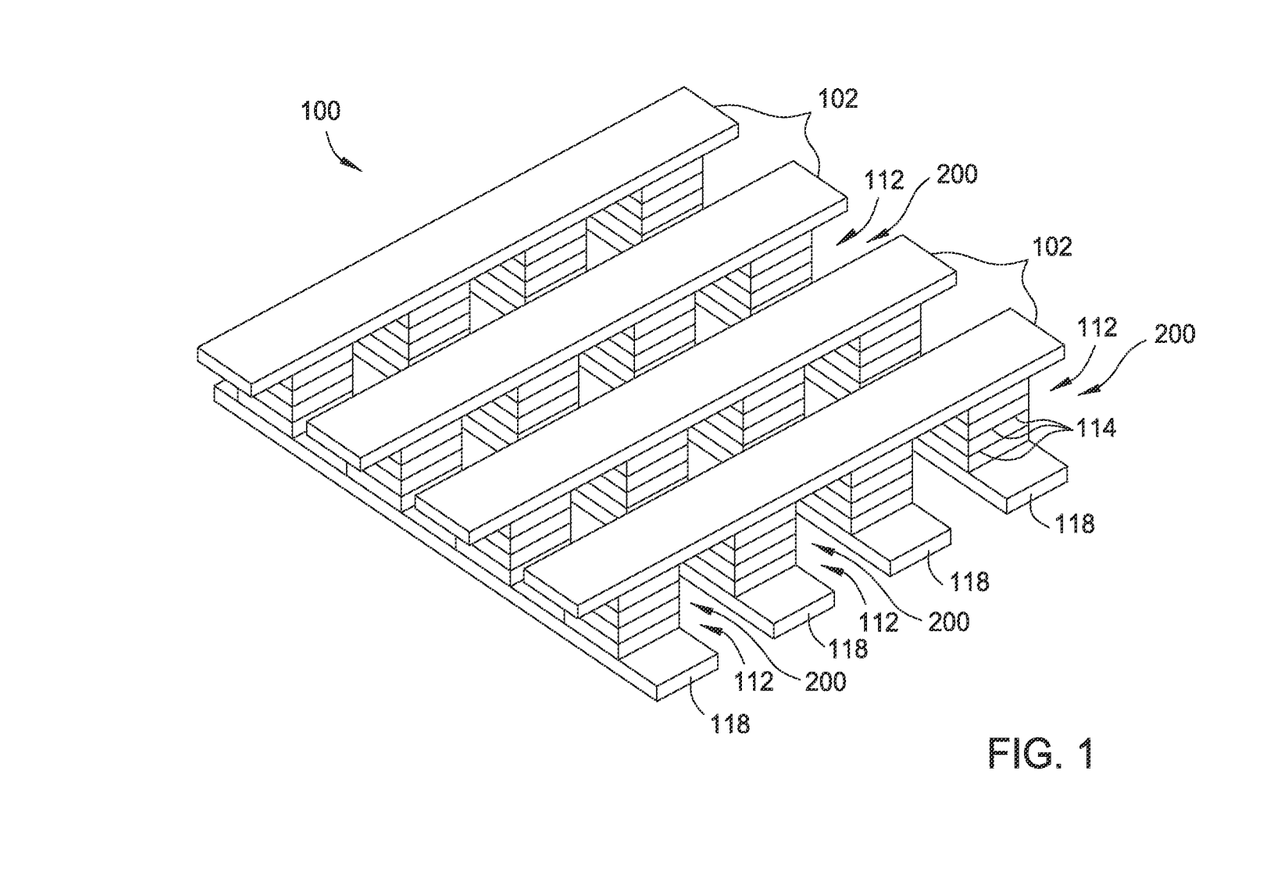
FIG. 1 is a perspective view of a memory array of memory devices.

A memory array 100 of nonvolatile resistive switching memory devices 200 (hereafter switching memory device 200), which each generally include at least one resistive switching memory element 112, is illustrated in FIG. 1. Memory array 100 may be part of a larger memory device or other integrated circuit structure, such as a system on a chip type device. Read and write circuitry is connected to switching memory devices 200 using word-lines and bit-lines, or interconnect lines, which are referred to herein generally as electrodes 102 and 118, and are used to read from or write data into the memory devices 200. Electrodes 102 and 118 generally include one or more conductive layers, each conductive layer having a desired function in the array of switching memory devices 200. In some configurations, the electrodes 102 and 118 each comprise two or more conductive layers in which a first conductive layer is used to interconnect the multiple switching memory devices 200 and a second conductive layer is disposed in each switching memory device 200 to provide a desirable electrical interface (e.g., desirable work function) to the adjacent components in the switching memory device 200. Individual switching memory devices 200 or groups of switching memory devices 200 can be accessed using appropriate sets of word-lines and bit-lines, or electrodes 102 and 118. The memory elements 112 in the switching memory devices 200 may be formed from one or more layers 114 of materials, as indicated schematically in FIG. 1. In addition, memory arrays such as memory array 100 can be stacked in a vertical fashion to make multilayer memory array structures. The use of resistive switching memory elements to form memory arrays is merely illustrative, and one skilled in the art will appreciate that the formed devices may be used in other device applications without deviating from the basic scope of the embodiments described herein.

Figure 2A:
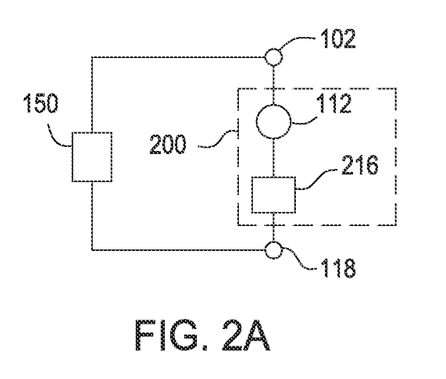
FIG. 2A is a schematic cross-sectional view of a memory device.

FIG. 2A schematically illustrates a switching memory device 200 that contains a memory element 112 and an optional current steering device 216, which are both disposed between the electrodes 102 and 118. In one configuration, the current steering device 216 is an intervening electrical component, such as a p-n junction diode, p-i-n diode, transistor, or other similar device that is disposed between electrode 102 and memory element 112, or between the electrode 118 and memory element 112. In some examples, the current steering device 216 may include two or more layers of semiconductor material, such as two or more doped silicon layers, that are configured to allow or inhibit the current flow in different directions through the memory element 112 when that memory element is not selected to read.

Figure 2B:
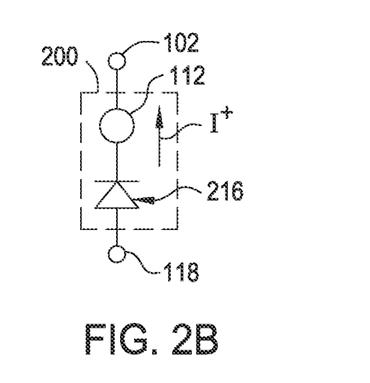
FIG. 2B schematically illustrates a memory device configured to allow current to flow through the memory device in a forward direction.

FIG. 2B schematically illustrates a switching memory device 200 that contains a memory element 112 and a diode type current steering device 216 that preferentially allows current to flow through the memory device 200 in a forward direction ("I$^+$"). However, due to the design of the current steering device 216, a reduced current can also flow in the opposing direction through the device by the application of a reverse bias to the electrodes 102 and 118.

Figure 2C:
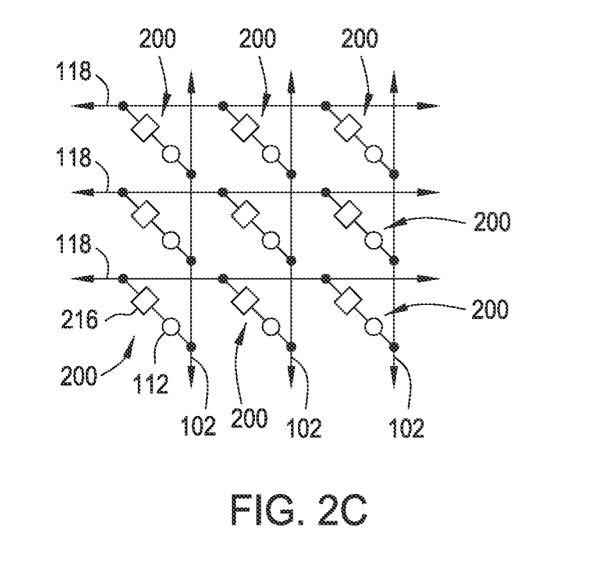
FIG. 2C is schematic representation of an array of memory devices.

FIG. 2C schematically illustrates an array of switching memory devices 200 that are connected together to form part of a high-capacity nonvolatile memory integrated circuit. Each of the individual switching memory devices 200 can be accessed using appropriate sets of discrete word-lines and bit-lines, or interconnect lines, which, as noted above, may comprise at least a portion of the electrodes 102 and 118. As illustrated in FIG. 2C, each of the switching memory devices 200 contains a memory element 112 and current steering device 216 (e.g., a diode type) that are connected to at least one of the electrodes 102 and at least one of the electrodes 118. The electrodes 102 and/or 118 are generally biased by circuitry that is connected at the periphery of the memory chip on which the array of memory devices 200 is formed.

Figure 2D:
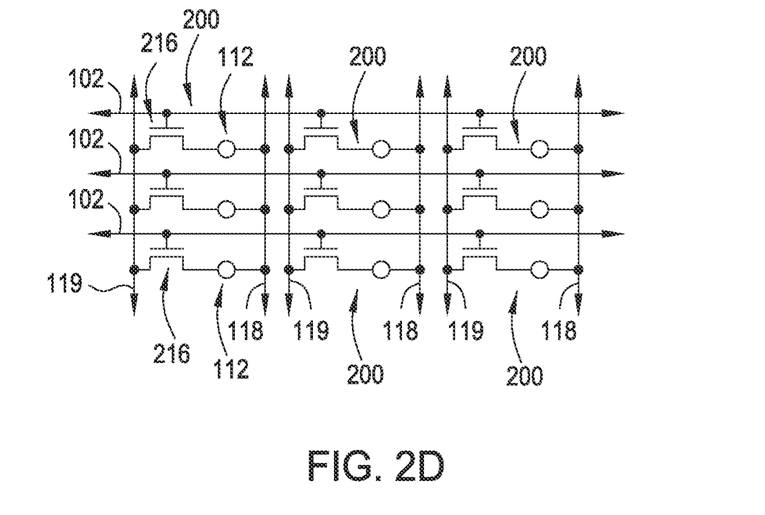
FIG. 2D is schematic representation of an array of memory devices.

FIG. 2D schematically illustrates an array of switching memory devices 200 that are connected together to form part of a high-capacity nonvolatile memory integrated circuit. As shown in FIG. 2D, the current steering device 216, such as a typical MOS type transistor, is used to selectively deliver current through the memory element 112 by use of the appropriate set of word-lines, bit-lines and separate source-lines 119. As illustrated in FIG. 2D, each of the switching memory devices 200 contains a memory element 112 and current steering device 216 (e.g., transistor) that are connected to at least one of the electrodes 102, at least one of the electrodes 118 and at least one of the source lines 119. The source-lines 119 generally comprise one or more patterned conductive layers (e.g., metal) that are adapted to provide a desired amount of current to the memory element 112 when the transistor in the current steering device is turned "on". The electrodes 102, electrodes 118 and source-lines 119 are typically biased by circuitry that is connected at the periphery of the memory chip on which the array of memory devices 200 are formed.

During operation, such as a read operation, the state of a memory element 112 in the switching memory device 200 can be sensed by applying a sensing voltage (i.e., a "read" voltage $V_{READ}$ (FIG. 3)), such as applying about +0.5 volts (V), to an appropriate set of electrodes 102 and 118. Depending on its history, a memory element that is addressed in this way may be in either a high resistance state (HRS) or a low resistance state (LRS). The resistance of the memory element 112 therefore determines what digital data is being stored by the memory element 112. If the memory element 112 is in the high resistance state, for example, the memory element may be said to contain a logic "zero" (i.e., a "0" bit). If, on the other hand, the memory element is in the low resistance state, the memory element may be said to contain a logic "one" (i.e., a "1" bit). During a write operation, the state of a memory element can be changed by application of suitable write signals to an appropriate set of electrodes 102 and 118.

Figure 3:
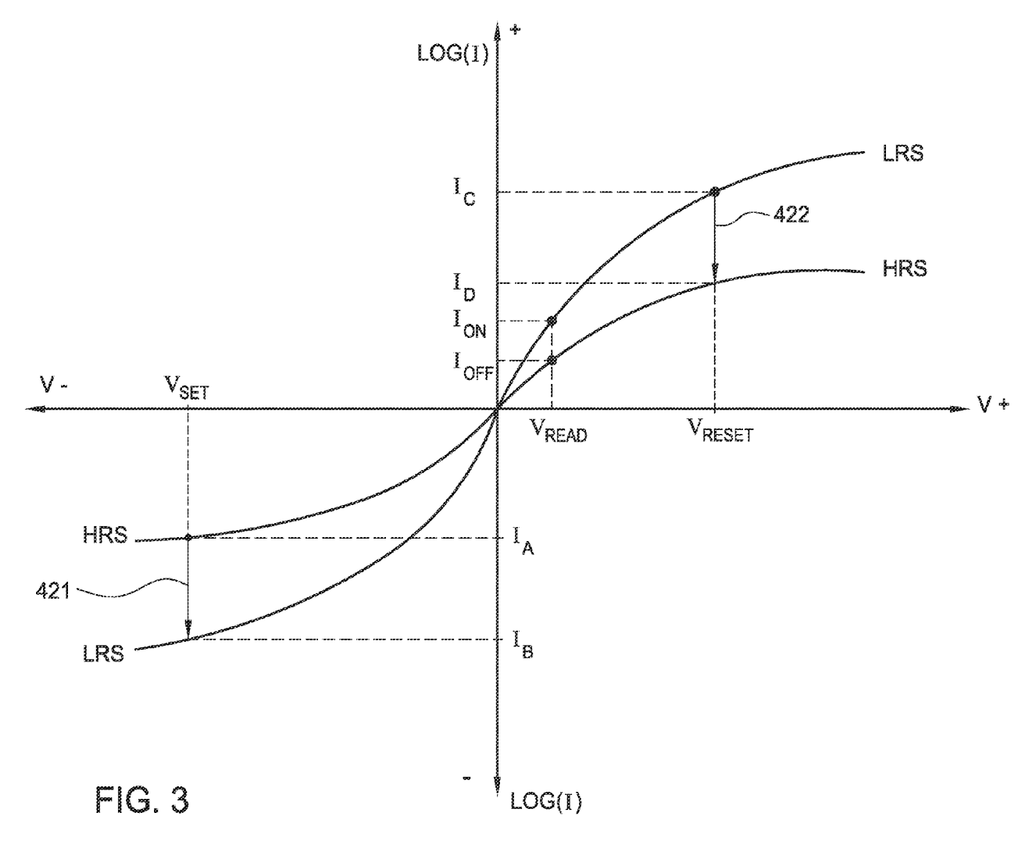
FIG. 3 is a graph illustrating the current (I) versus voltage (V) characteristics of the high and low resistance load lines of a resistive switching layer.

In some embodiments, the memory element 112 uses bipolar switching where opposite polarity set and reset voltages are used to alter the resistance of the memory element between high and low resistance states. FIG. 3 is a log-log plot of current (I) versus voltage (V) of one example of the low-resistance-state (LRS) and high-resistant-state (HRS) curves of a memory element 112 having these two bistable resistive states. The voltage levels $V_{SET}$ and $V_{RESET}$, shown in FIG. 3, illustrate typical threshold values used to "set" and "reset" the contents of a memory element 112. In some embodiments, initially, memory element 112 may be in a high resistance state (e.g., storing a logic "zero"). The high resistance state of memory element 112 can be sensed by read and write circuitry 150 (FIG. 2A) using electrodes 102 and 118. In some examples, read and write circuitry may apply a read voltage $V_{READ}$ to memory element 112, and can sense the resulting "off" current ($I_{OFF}$) that flows through memory element 112. When it is desired to store a logic "one" in memory element 112, memory element 112 can be placed into its low-resistance state. This may be accomplished by using read and write circuitry 150 to apply a set voltage $V_{SET}$ (e.g., −1 V to −4 V) across electrodes 102 and 118. In one configuration, applying a negative $V_{SET}$ voltage to memory element 112 causes memory element 112 to switch to its low resistance state. It is believed that the change in the resistive state of memory element 112 may be due to the redistribution or filling of traps (i.e., "trap-mediated") or defects in the resistive switching layer 206 (FIGS. 4A and 5A) of memory element 112, when the memory device 200 is reverse biased. The defects or traps, which are commonly thought to be oxygen vacancies, may be formed during the deposition and/or post-processing of the resistive switching layer 206. In some examples, the defects may be created by a non-stoichiometric material composition found in the formed resistive switching layer 206.

The low resistance state of the memory element 112 can be sensed using the read and write circuitry 150. When a read voltage $V_{READ}$ is applied to resistive switching memory element 112, the read and write circuitry 150 will sense the relatively high "on" current value ($I_{ON}$), indicating that memory element 112 is in its low resistance state. When it is desired to store a logic "zero" in memory element 112, the memory element can once again be placed in its high resistance state by applying a positive reset voltage $V_{RESET}$ (e.g., +1 V to +5 V) to memory element 112. When read and write circuitry applies $V_{RESET}$ to memory element 112, memory element 112 enters its high resistance state. When the reset voltage $V_{RESET}$ is removed from memory element 112, memory element 112 will once again be characterized by high resistance when the read voltage $V_{READ}$ is applied. Voltage pulses can be used in the programming of the memory element 112. For some examples, a 1 microseconds (ms) to 1 nanoseconds (ns) square or trapezoidal shaped pulse can be used to switch the memory element 112. In some embodiments, it may be desirable to adjust the length of the pulse depending on the amount of time needed to switch the memory element 112. In some examples, the "set" and "reset" pulses are each about 10 ns in length. While the discussion of the memory element 112 herein primarily provides bipolar switching examples, some embodiments of the memory element 112 may use unipolar switching, where the set and reset voltages have the same polarity.

Figure 4A:
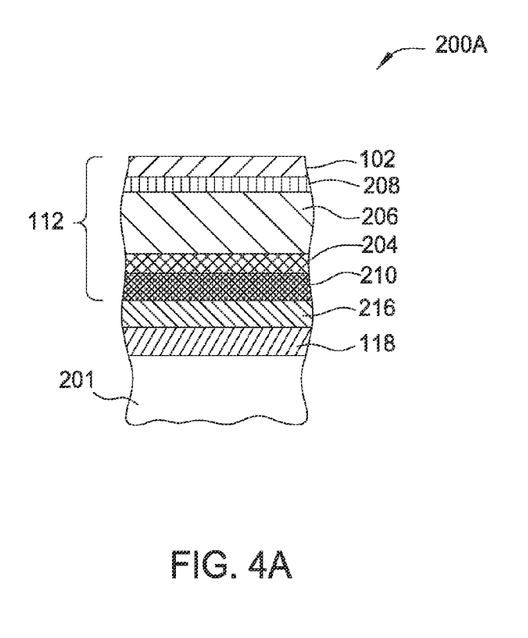
FIG. 4A is a schematic cross-sectional view of a standard memory element disposed in a nonvolatile memory device.
Figure 4B:
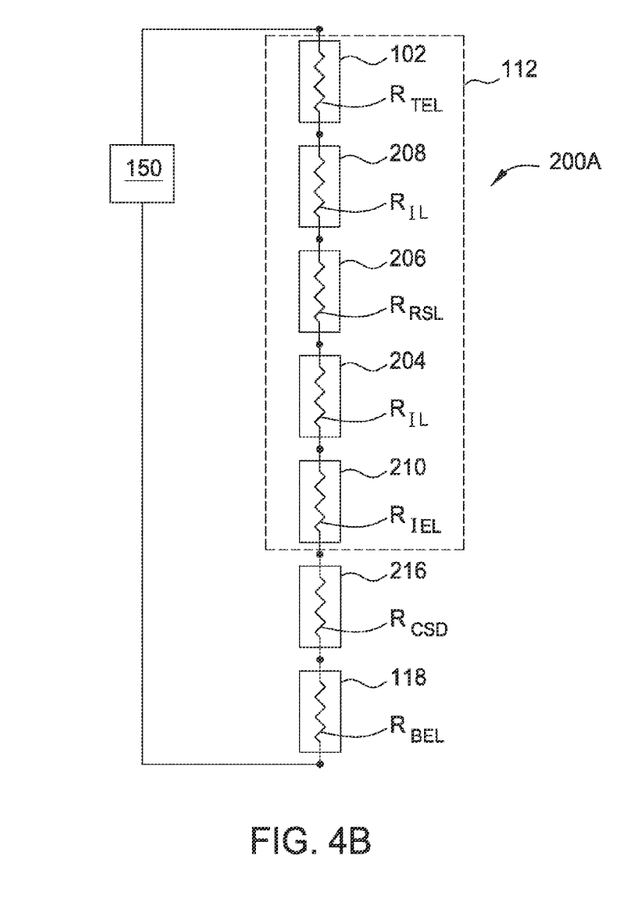
FIG. 4B is a schematic representation of an electrical circuit formed in the standard memory element illustrated in FIG. 4A.

FIG. 4A is a schematic cross-sectional view of the layers of an un-optimized switching memory device 200, which contains a memory element 112 and a current steering device 216 (e.g., a diode) that is formed over a substrate 201. In this configuration, the memory element 112 generally contains a top electrode 102, interfacial layer 208, resistive switching layer 206, interfacial layer 204 and intermediate electrode 210. FIG. 4B schematically illustrates an electrical circuit formed in the switching memory device 200 shown in FIG. 4A. As illustrated in FIG. 4B, the electrical circuit within the standard switching memory device 200 includes a top electrode impedance (i.e., resistance $R_{TEL}$) created by the material layer(s) in the top electrode 102, a resistive switching layer impedance (i.e., resistance $R_{RSL}$) created by the material layer(s) in the resistive switching layer 206, interfacial layers impedance (i.e., resistance $R_{IL}$) created by the oxidation of the electrode materials on either side of the resistive switching layer 206, an intermediate electrode impedance (i.e., resistance $R_{IEL}$) created by the material layer(s) in the intermediate electrode 210, a current steering device impedance (i.e., resistance $R_{CSD}$) created by the material layer(s) in the current steering device 216 and a bottom electrode impedance (i.e., resistance $R_{BEL}$) created by the material layer(s) in the bottom electrode 118.

Interfacial layer 204, between intermediate electrode 210 and resistive switching layer 206, may be formed by the oxidation of the electrode layer during a vacuum break within the manufacturing process. In some examples, once intermediate electrode 210 is deposited, and during the transfer of the substrate to a different chamber for the deposition of the resistive switching layer 206, any exposure to atmosphere will cause the growth of an oxide interfacial layer 204 on intermediate electrode 210. Interfacial layers 204 and 208 may also be formed by the reaction of the oxygen in the metal oxide resistive switching layer 206 with the conductive materials in the adjacent electrodes (210 and 102, respectively). The electrodes 102, 210 and 118 are generally formed from a conductive material, such as a highly conductive semiconductor material (e.g., p-type polysilicon, n-type polysilicon) and/or metal (e.g., TiN, Al, W) to minimize the circuit resistance created between interconnected devices in a memory array 100. The resistive switching layer 206 can be a dielectric material, such as a metal oxide material or other similar material that can be switched between at least two or more stable resistive states. In some examples, the high and low resistance states of the resistive switching layer 206 may be about 2.5 MΩ and about 100 kΩ, respectively. The resistance of each of the interfacial layers 204 and 208, formed between electrodes 102 and 210 and the resistive switching layer 206, may be between about 100 kΩ and about 1 GΩ. As one skilled in the art would appreciate, the resistance of the interfacial layers will vary with device size, layer thicknesses and materials. The presence of interfacial layers 204 and 208 increases forming and operating program voltages for memory device 200 and also introduces unneeded variability into the device design and manufacturing processes.

While the current steering device 216 may include two or more layers of semiconductor material that are adapted to control the flow of current through the formed memory device 200, the resistance of each of the components in the current steering device 216 are not individually discussed herein to minimize the complexity of the discussion, and thus an overall current steering device resistance $R_{CSD}$ is used to represent the overall impedance of the current steering device 216.

Figure 5A:
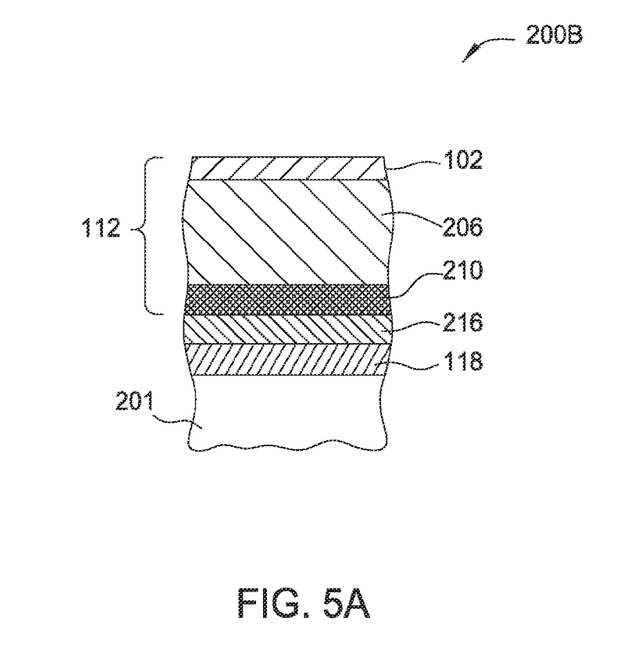
FIG. 5A is a schematic cross-sectional view of a memory element disposed in a nonvolatile memory device.

FIG. 5A is a schematic cross-sectional view of one example of some embodiments of the layers of an improved switching memory device 200B that contains a memory element 112 and a current steering device 216 that are disposed between electrodes 102 and 118 and are formed over a portion of substrate 201. In this configuration, the memory element 112 will generally contain a top electrode 102, a variable resistive switching layer 206 and an optional intermediate electrode 210. A resistive switching layer 206 is formed between two electrodes where the resistive switching layer 206 and the two electrodes all comprise the same elemental metal material. For example, in some embodiments, intermediate electrode 210 comprises hafnium, resistive switching layer 206 comprises hafnium oxide and top electrode 102 comprises hafnium. In other embodiments, intermediate electrode 210 comprises aluminum, resistive switching layer 206 comprises aluminum oxide and top electrode 102 comprises aluminum. In yet other embodiments, intermediate electrode 210 comprises titanium, resistive switching layer 206 comprises titanium oxide and top electrode 102 comprises titanium. In additional embodiments, the resistive switching layer 206 and adjacent electrodes comprise the same elemental metal such as tantalum, lanthanum, yttrium, vanadium, dysprosium, niobium, ytterbium, tungsten and zirconium. The use of common metal elemental materials for the resistive switching layer 206 and the adjacent electrodes 210 and 102 eliminates the formation of unwanted native oxide interfacial layers (204 and 208, FIG. 4A) formed during the manufacturing process caused by the oxidation of electrode elemental materials that do not comprise the same elemental material as that of resistive switching layer 206.

Figure 5B:
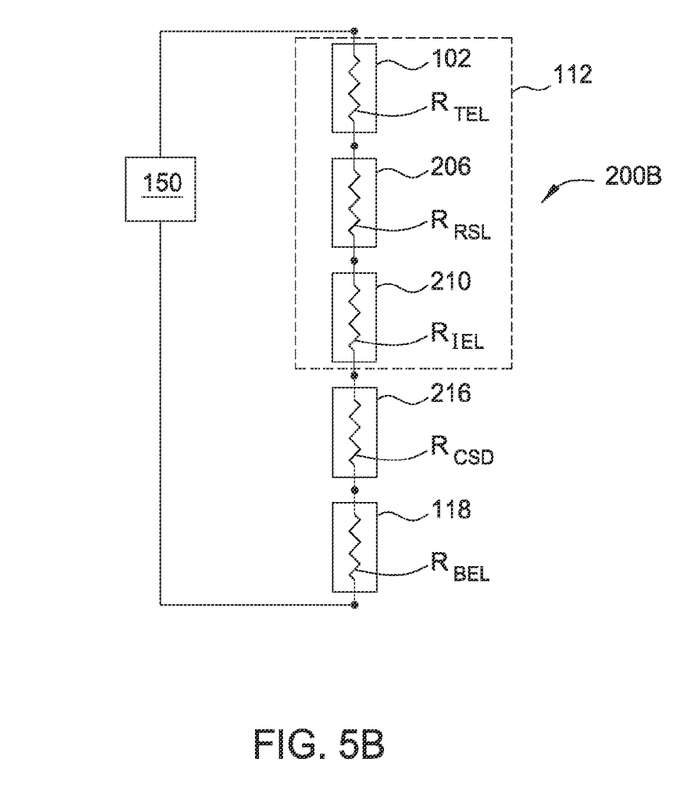
FIG. 5B is a schematic representation of an electrical circuit formed in the memory element illustrated in FIG. 5A.

FIG. 5B schematically illustrates an electrical circuit formed in the switching memory device 200B shown in FIG. 5A. As illustrated in FIG. 5B, the electrical circuit within the improved memory element 112 and within switching memory device 200B includes a top electrode impedance (i.e., resistance $R_{TEL}$) created by the material layer(s) in the top electrode 102, a resistive switching layer impedance (i.e., resistance $R_{RSL}$) created by the material layer(s) in the resistive switching layer 206, an intermediate electrode impedance (i.e., resistance $R_{IEL}$) created by the material layer(s) in the intermediate electrode 210, a current steering device impedance (i.e., resistance $R_{CSD}$) created by the material layer(s) in the current steering device 216 and a bottom electrode impedance (i.e., resistance $R_{BEL}$) created by the material layer(s) in the bottom electrode 118. Noticeably absent from the electrical circuit of the improved switching memory device 200B as shown in FIG. 5B is the impedance of the interfacial layers 204 and 208 adjacent to resistive switching layer 206 as shown in FIG. 4B.

Figure 6:
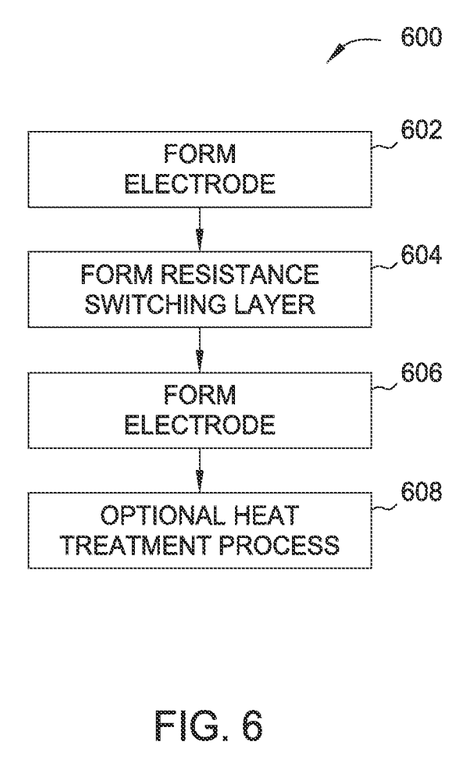
FIG. 6 shows a process for forming the switching memory device in FIG. 5A.

FIG. 6 illustrates a process (method) 600 for forming an improved switching memory device 200B (FIG. 5B). Although the method steps are described in conjunction with memory device 200B and in particular to improved memory element 112, persons skilled in the art will understand that formation of other resistive switching memory devices using process 600 is possible. Note that the process for forming the current steering device is not shown in FIG. 6.

Process 600 begins at step 602 in which an electrode is formed on or over substrate 201, which may be electrode 118 or intermediate electrode 210. In some embodiments, the first layer is an electrode, such as the bottom electrode 118 or intermediate electrode 210 shown in FIG. 5A. The electrodes 102, 210 and 118, although generally formed from a conductive material, such as a highly conductive semiconductor material (e.g., p-type polysilicon, n-type polysilicon) and/or metal (e.g., TiN, Al, W), the electrodes 102, 210 and 118 for improved memory device 200B are formed from the same metal elemental material as is used in forming the resistive switching layer 206. In some embodiments, electrodes 118 or 210 are formed using hafnium on or over substrate 201 using a conventional CVD or ALD type deposition technique. In some embodiments, electrode 118 and/or electrode 210 comprises hafnium, and is between about 50 and about 5000 Å thick.

In step 604, resistive switching layer 206 is formed on or over an electrode, such as electrode 118 or intermediate electrode 210, using one or more deposition processes. Resistive switching layer 206 comprises a dielectric material that can be switched between two or more stable resistive states. In some embodiments, resistive switching layer 206 is an ultrathin layer that has a thickness of less than about 5 nanometers (nm), for some examples from about 2 nm to about 5 nm. Conventional resistive switching layers are generally between 20 to 30 nm thick, thus embodiments described provide resistive switching layers that generally may be an order of magnitude thinner than conventional films. During a typical memory device formation process, an interfacial layer of oxide material would form over the electrode material either by the growth of a native oxide material due to the electrode material's exposure to atmosphere as the wafer is transferred from one processing chamber to another. Alternatively, the native oxide layer may form because of the reaction of the electrode metal material with the oxidizing agent during the deposition of the metal oxide resistive switching layer. In the case of the improved memory element 200B because the electrode 118 or 210 are made of the same elemental materials as the resistive switching layer, any growth of native oxides are fully compatible with and have the same chemical makeup as the resistive switching layer and as such do not contribute to an increased circuit impedance.

Referring to FIGS. 5A and 6, at step 604, the resistive switching layer 206, comprising the same elemental material as the underlying intermediate electrode 210, is deposited using a PVD, CVD or ALD deposition process. The resistive switching layer 206 may comprise a metal oxide layer, such as $Hf_xO_y$, $Ta_xO_y$, $Al_xO_y$, $La_xO_y$, $Y_xO_y$, $Dy_xO_y$, $Yb_xO_y$, and/or $Zr_xO_y$, as long as the metal elemental material is the same metal element used in the formation of the underlying or intermediate electrode 210. The resistive switching layer 206 may be formed to a thickness of between about 20 Å and about 100 Å angstroms, such as between about 20 Å and about 50 Å. The resistive switching layer 206 can be deposited using any desired technique, but in some embodiments described herein is deposited using an ALD process. In some examples, an ALD process using tetrakis(dimethylamino) hafnium (TDMAH) and an oxygen containing precursor (e.g., water vapor) at a temperature of about 250° C. is used to form a 30 Å thick hafnium oxide ($Hf_xO_y$) which acts as the resistive switching layer 206.

In step 606, electrode 102 is formed above resistive switching layer 206, as shown in FIG. 5A, using the same metal elemental material common to both the underlying resistive switching layer 206 and the underlying electrode. Electrode 102 may be formed using a deposition process, such as a PVD, CVD, ALD or other similar process. In some embodiments, electrode 102 is between about 500 Å and 1 µm thick. As described above with regards to step 602 and the formation of electrode 118 or 210, and now again with the deposition of top electrode 102, a native oxide layer may form during the deposition of the top electrode 102 as the metal elemental material of the top electrode reacts with the oxygen with the metal oxide in the resistive switching layer. As is the case throughout the improved memory element 200B, top electrode layer 102, as well as electrode 118 or 210, are made of the same elemental materials as the resistive switching layer so any growth of native oxides adjacent to the resistive switching layer 206 is fully compatible with and has the same chemical makeup as the resistive switching layer, and thus does not contribute to any increase of unwanted and unnecessary impedance from non-compatible interfacial layers.

In optional step 608, the memory device 200B formed can be thermally processed, e.g., via an anneal process, (optional heat treatment process). The temperature and duration specification for such an anneal process is a function of the configuration of memory device 200B as well as the (elemental) materials included in memory device 200. For example, in some embodiments, the anneal process takes place at a temperature of greater than about 200° C. In other embodiments, the anneal process takes place at a temperature of greater than about 600° C. In yet other embodiments, the anneal process takes place at a temperature of greater than about 1000° C. The duration of the anneal process can also vary greatly, e.g. varying between about 30 seconds and 20 minutes depending on the configuration of memory device 200B. Furthermore, vacuum anneals, oxygen anneals, anneals using gas mixtures, such as a hydrogen/argon mixture, and other anneal processes known in the art fall may be used. Similarly, multiple thermal processing steps may be performed on memory device 200, for some examples, a thermal process may be performed during or after multiple steps of method 600. The process(es) performed at optional heat treatment process step 608, are generally configured to cause the layers in the switching memory device 200B to form one or more desirable material properties at the interface between adjacent layers as well as to activate and/or desirably process (heat treat) the other layers formed in the switching memory device. Advantageously, for an optimized memory element such as memory element 200B, the anneal (heat treatment) step 608 may also transform to stoichiometric any non-stoichiometric material regions, near the interface of the material layer adjacent to the electrodes caused by the deposition process, of the otherwise stoichiometric metal oxide resistive switching layer 206.

Figure 7:
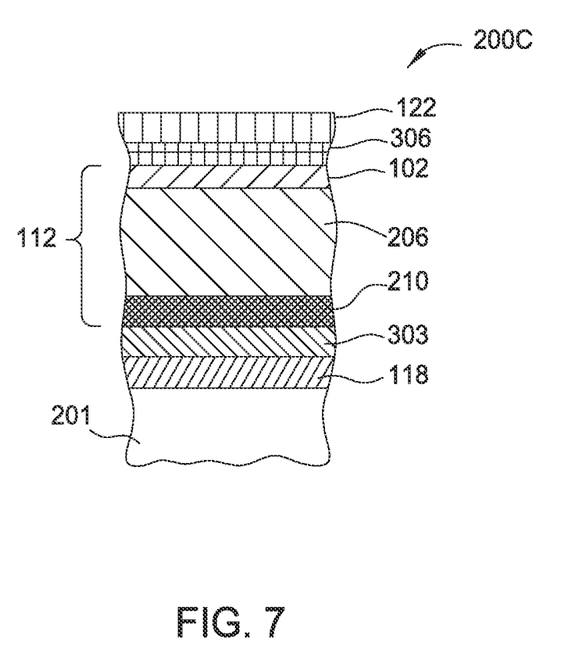
FIG. 7 is a schematic cross-sectional view of a memory element disposed in a nonvolatile memory device.

FIG. 7 schematically illustrates a cross-sectional view of memory device 200C. Memory device 200C includes the same optimized memory element 112 as shown in FIG. 5A and described above, but includes additional metal encapsulation layers 303 and 306 to ensure good electrical contact between memory element 112 and the electrode 118 (device interconnect layer) and upper overlay electrode 122 (device interconnect layer), wherein lower and upper electrode layer interface regions of electrodes 118 and 102, respectively, are directly in contact with and adjacent to the lower surface of the upper metal encapsulation layer 306 and are directly in contact with and adjacent to the upper surface of the lower metal encapsulation layer 303, respectively, and act as the metal interconnect layers for the nonvolatile memory array 100 (FIG. 1). For example, in some embodiments, memory element 112 includes electrode 210, resistive switching layer 206 and top electrode 102, where the electrodes are formed with the same elemental metal used in the metal oxide resistive switching layer. However, because the conductive properties of the elemental metal, whose oxide was chosen for its switching properties to form the metal oxide resistive switching layer, may not be the most favorable conductive elemental metal contact material to use as the array's lower and upper electrode layers (e.g., 118 and 102, in previous embodiments), or to satisfactorily electrically connect with the electrode layers (e.g., 118 and 102, in previous embodiments), additional encapsulation layers using different materials with better electrical contact properties may be formed between the electrodes 118 and 122. In such an arrangement upper and lower electrode layer interface regions of electrodes 118 and 122, respectively, are directly in contact with and adjacent to the lower surface of the upper metal encapsulation layer 306 and directly in contact with and adjacent to the upper surface of the lower metal encapsulation layer 303, respectively, to ensure good ohmic contact. Nonvolatile memory device 200C may comprise encapsulation layers 303 and 306 between memory element 112 and upper and lower electrode layer interface regions of electrodes 118 and 122, respectively. Because the elemental materials for electrodes 210 and 102 were selected for their compatibility with the elemental materials of resistive switching layer 206 so as not to create unwanted and unnecessary interfacial layers during the deposition processes, care must also be taken to select a metal material for the encapsulation layers that will provide the good ohmic connectivity necessary for the device structure and yet will also not create unwanted native oxide interfacial layers. For example, titanium (Ti) has an affinity for oxygen and as such will combine with freely available oxygen ions. Thus, Ti when used as the material for the encapsulation layer, Ti will combine with oxygen ions and any growth of an interfacial oxide layer adjacent to the Ti layers is severely limited. Additional metal materials that have an affinity for oxygen also provide good ohmic properties and are suitable as encapsulation metals are copper, aluminum, indium, gallium, niobium, and magnesium.

Referring again to FIG. 7, electrode layer 118 may be aluminum and may be between 50 Å and 5000 Å thick, such as 500 Å. Encapsulation layer 303 may be titanium and be between 20 Å and 100 Å thick such as 50 Å. Intermediate electrode 210 may be hafnium and is between about 50 Å and about 5000 Å thick. The resistive switching layer 206 may be hafnium oxide and be formed to a thickness of between about 20 Å and about 100 Å angstroms, such as 30 Å. Electrode 102 may be hafnium and is between about 500 Å and 1 µm thick. Encapsulation layer 306 may be titanium and be between 20 Å and 100 Å thick such as 50 Å. The upper electrode layer interface region of electrode 102 may be formed from highly conductive metal such as tungsten to minimize the circuit resistance created between interconnected devices in memory array 100 (FIG. 1). The tungsten layer may be between 50 Å and 5000 Å thick, such as 500 Å. Each of these layers may be formed using a deposition process, such as a PVD, CVD, ALD or other similar process.

Embodiments described provide for an optimized memory element using an elemental metal oxide material for the resistive switching layer and using the same elemental metal material for the adjacent electrodes as used for the resistive switching layer. Providing a memory element with common elemental metal materials used for the resistive switching layer and each of the adjacent electrodes eliminates the formation of unwanted native oxide interfacial layers caused by the memory element formation processes and as such eliminates the additional electrical impedances associated with such layers, thereby reducing variability in the resistance of the designed device and further reducing the necessary forming and programming voltages.

The foregoing embodiments are merely illustrative of the principles described and various modifications can be made by those skilled in the art without departing from the scope and spirit of the invention as defined by the claims that follow.

The invention claimed is:

1. A nonvolatile memory element comprising:
   a first electrode layer;
   a second electrode layer;
   a resistive switching layer disposed between the first electrode layer and the second electrode layer;
   a first encapsulation layer formed between and directly contacting a first device interconnect layer and a bottom surface of the first electrode layer; and
   a second encapsulation layer formed between and directly contacting a top surface of the second electrode layer and a second device interconnect layer,
   wherein the first electrode layer, the second electrode layer and the resistive switching layer each comprise the same metal, and
   wherein the first encapsulation layer and the second encapsulation layer each include a material that is reactive with oxygen,
   wherein the first and second encapsulation layers comprise one or more of copper, aluminum, indium, gallium, niobium, or magnesium.

2. The nonvolatile memory element of claim 1, wherein the resistive switching layer comprises a metal oxide layer.

3. The nonvolatile memory element of claim 1, wherein the metal selected for the first electrode layer, the second electrode layer and the resistive switching layer comprises one or more of hafnium, tantalum, titanium, aluminum, lanthanum, yttrium, vanadium, dysprosium, niobium, ytterbium, tungsten or zirconium.

4. The nonvolatile memory element of claim 1, wherein the resistive switching layer has a thickness from 2 to 5 angstroms.

5. The nonvolatile memory element of claim 1, wherein the resistive switching layer has a thickness from 20 to 30 angstroms.

6. The nonvolatile memory element of claim 1, wherein the metal used for the first electrode layer, the second electrode layer and the resistive switching layer comprises hafnium.

7. The nonvolatile memory element of claim 1, wherein the metal used for the first electrode layer, the second electrode layer, and the resistive switching layer comprises aluminum.

8. The nonvolatile memory element of claim 1, wherein the metal used for the first electrode layer, the second electrode layer, and the resistive switching layer comprises titanium.

9. A method of forming a nonvolatile memory element in a ReRAM device comprising:
   forming a resistive switching layer over a first electrode layer;
   forming a second electrode layer, so that the resistive switching layer is disposed between the first electrode layer and the second electrode layer;
   forming a first encapsulation layer between and directly contacting a first device interconnect layer and a bottom surface of the first electrode layer; and
   forming a second encapsulation layer between and directly contacting a top surface of the second electrode layer and a second device interconnect layer,
   wherein the first electrode layer, the second electrode layer and the resistive switching layer each comprise the same metal, and
   wherein the first encapsulation layer and the second encapsulation layer each include a material that is reactive with oxygen,
   wherein the first and second encapsulation layers comprise one or more of copper, aluminum, indium, gallium, niobium, or magnesium.

10. The method of claim 9, wherein the resistive switching layer comprises a metal oxide layer.

11. The method of claim 9, wherein the metal selected for the first electrode layer, the second electrode layer and the resistive switching layer comprise one or more of hafnium, tantalum, titanium, aluminum, lanthanum, yttrium, vanadium, dysprosium, niobium, ytterbium, tungsten or zirconium.

12. The method of claim 9, wherein the resistive switching layer has a thickness from 2 to 5 angstroms.

13. The method of claim 12, wherein the resistive switching layer has a thickness from 20 to 30 angstroms.

14. The method of claim 9, wherein the metal used for the first electrode layer, the second electrode layer and the resistive switching layer comprises hafnium.

15. The method of claim 9, wherein the metal used for the first electrode layer, the second electrode layer and the resistive switching layer comprises aluminum.

16. The method of claim 9, wherein the metal used for the first electrode layer, the second electrode layer and the resistive switching layer comprises titanium.

17. The nonvolatile memory element of claim 1, wherein a first material included in the first encapsulation layer and a second material included in the second encapsulation layer are each more conductive than the metal included in the first electrode layer, the second electrode layer, and the resistive switching layer.

18. The method of claim 9, wherein a first material included in the first encapsulation layer and a second material included in the second encapsulation layer are each more conductive than the metal included in the first electrode layer, the second electrode layer, and the resistive switching layer.

* * * * *